(12) United States Patent
Rossi et al.

(10) Patent No.: US 7,005,724 B2
(45) Date of Patent: Feb. 28, 2006

(54) SEMICONDUCTOR DEVICE AND A METHOD OF MANUFACTURE THEREFOR

(75) Inventors: Nace Rossi, Singapore (SG); Alvaro Maury, Pulau Pinang (MY)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/778,454

(22) Filed: Feb. 13, 2004

(65) Prior Publication Data

US 2005/0179116 A1    Aug. 18, 2005

(51) Int. Cl.
*H01L 23/58* (2006.01)
(52) U.S. Cl. ............... 257/649; 257/650; 257/639; 257/640; 257/641; 257/760; 257/750; 257/751; 257/758; 257/747; 438/723; 438/724
(58) Field of Classification Search ........... 438/723, 438/724; 257/646, 642, 639, 640, 641, 758, 257/628, 315, 316, 192, 193, 194, 649, 650, 257/760, 750, 751, 747
See application file for complete search history.

(56) References Cited

U.S. PATENT DOCUMENTS

| | | | | |
|---|---|---|---|---|
| 6,091,121 A | * | 7/2000 | Oda | 257/408 |
| 6,100,559 A | * | 8/2000 | Park | 257/315 |
| 6,306,758 B1 | * | 10/2001 | Park | 438/636 |
| 6,617,690 B1 | * | 9/2003 | Gates et al. | 257/758 |
| 2004/0061129 A1 | * | 4/2004 | Saxler et al. | 257/192 |
| 2004/0166603 A1 | * | 8/2004 | Carley | 438/52 |
| 2004/0173886 A1 | * | 9/2004 | Carley | 257/678 |

* cited by examiner

*Primary Examiner*—Nathan J. Flynn
*Assistant Examiner*—Fazli Erdem (57) ABSTRACT

The present invention provides a semiconductor device, a method of manufacture therefor, and an integrated circuit including the aforementioned semiconductor device. The semiconductor device, in accordance with the principles of the present invention, may include a substrate, and a graded capping layer located over the substrate, wherein the graded capping layer includes at least two different layers, wherein first and second layers of the at least two different layers have different stress values.

16 Claims, 6 Drawing Sheets

SEMICONDUCTOR DEVICE AND A METHOD OF MANUFACTURE THEREFOR

TECHNICAL FIELD OF THE INVENTION

The present invention is directed, in general, to a semiconductor device, more specifically, to a semiconductor device having a graded capping layer and a method of manufacture therefor.

BACKGROUND OF THE INVENTION

To accommodate higher packing density in present integrated circuits, electrical connections to integrated circuit devices formed in a semiconductor substrate are made by multilayer interconnects. Each level of multilayer interconnects is supported over the semiconductor substrate by an interlevel dielectric. Generally, the integrated circuit structure includes a dielectric layer and metal lines are laid down in parallel strips on top of the dielectric layer. Additional levels of multilayer interconnects are formed over this dielectric layer, each including additional metal interconnects and an interlevel dielectric layer.

Fluoro-silicate glass (FSG) is one such material used as an inter-metal dielectric in semiconductor backend processing. FSG is used for many reasons, however, it is particularly well suited as a result of its improved gapfill capacity and reduced oxide dielectric constant. Lowering the dielectric constant reduces the inter/intra level capacitance of the metal lines, enhancing the operating speed of the devices.

FSG is often capped with a silicon-rich oxide (SRO) layer. The SRO layer attempts to reduce, if not prevent, fluorine from diffusing from the FSG layer to the bottom Ti/TiN metal stack. The SRO is typically deposited using a plasma enhanced chemical vapor deposition (PECVD) process. Often, however, this PECVD process causes the SRO layer to have various degrees of stress, depending on the deposition conditions. Therefore, the stress of the SRO layer can be tailored to go from slightly tensile, to highly compressive, depending on these conditions.

The most prevalent deposition condition that controls this degree of stress is the frequency at which the SRO layer is deposited. For example, the SRO layer may be deposited using a single or dual frequency process. As compared to a single frequency process, a dual frequency process requires that both the upper and lower electrodes be modulated at a particular, and often different, frequency.

The conventional practice is to deposit a single layer of slightly tensile SRO on top of the FSG layer using the single frequency process. Unfortunately, the tensile stress of the aluminum dominates the total stress, and the wafer becomes increasingly warped as the metal/dielectric levels are formed. A way to minimize this wafer warpage is to deposit a highly compressive SRO layer to counteract the tensile stress of the aluminum layer. This highly compressive SRO layer is typically formed using the aforementioned dual frequency process. Nevertheless, the highly compressive SRO layer often causes excessive lateral diffusion of fluorine to occur, which may further lead to metal attack.

Accordingly, what is needed in the art is a capping layer, or method of manufacture therefore, that does not introduce the problems introduced by the prior art capping layers.

SUMMARY OF THE INVENTION

To address the above-discussed deficiencies of the prior art, the present invention provides a semiconductor device, a method of manufacture therefor, and an integrated circuit including the aforementioned semiconductor device. The semiconductor device, in accordance with the principles of the present invention, may include a substrate and a graded capping layer located over the substrate, wherein the graded capping layer includes at least two different layers, wherein first and second layers of the at least two different layers have different stress values.

As previously mentioned, the present invention also provides a method for manufacturing the semiconductor device disclosed above. Among other steps, the method includes providing a substrate, and forming a graded capping layer over the substrate. In this embodiment the graded capping layer includes at least two different layers, wherein first and second layers of the at least two different layers have different stress values.

Additionally, the present invention provides an integrated circuit including the aforementioned semiconductor device. The integrated circuit, among other elements, includes: (1) transistors located over a semiconductor substrate, (2) an interlevel dielectric layer located over the transistors, (3) a graded capping layer located over the interlevel dielectric layer, wherein the graded capping layer includes at least two different layers, wherein first and second layers of the at least two different layers have different stress values, and (4) interconnects located in the interlevel dielectric layer for contacting the transistors and thereby forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
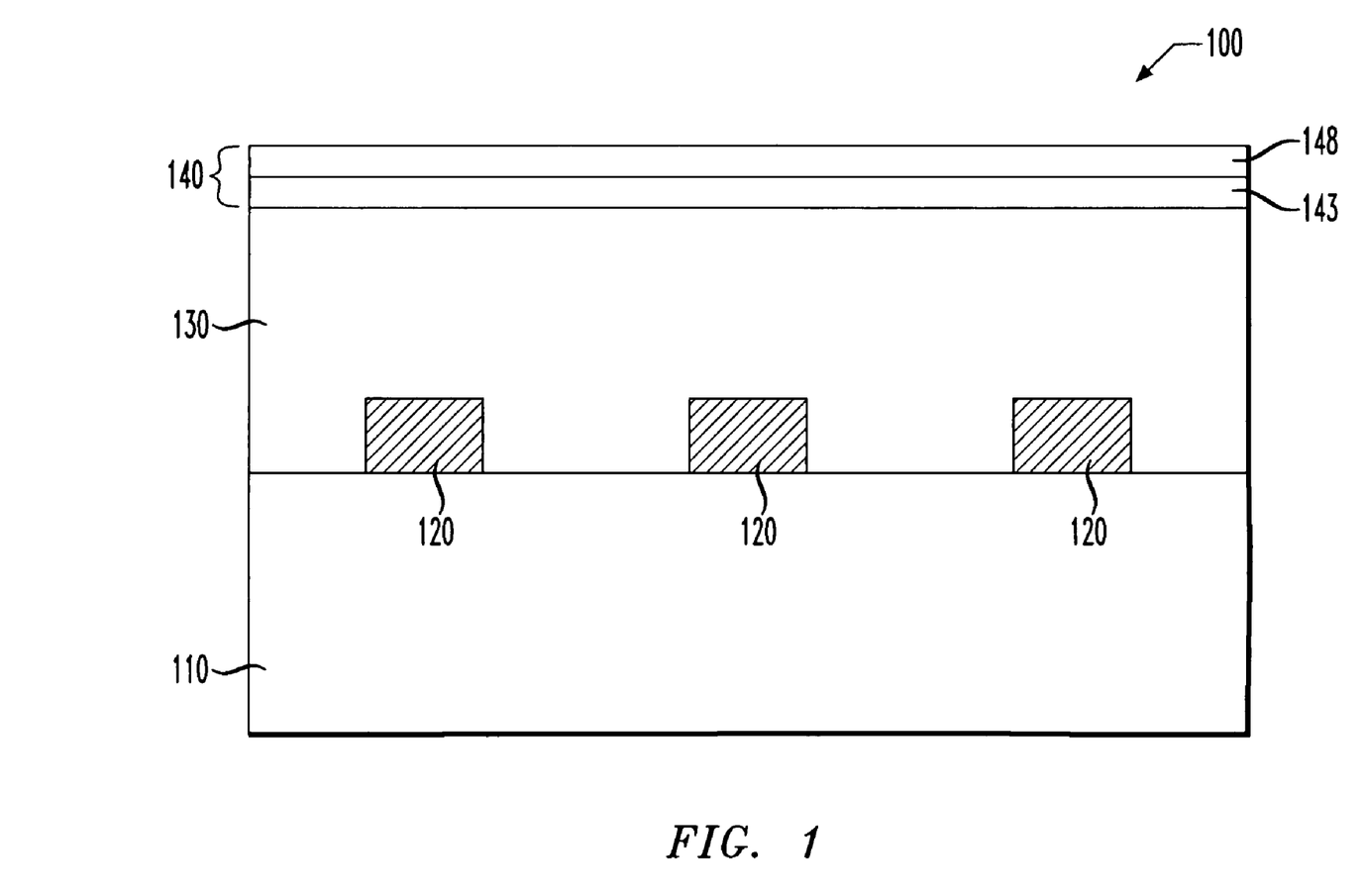
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110 having conductive features 120 located thereon. The substrate 110 might be an interlevel dielectric layer and the conductive features 120 might be runners located on the dielectric layer 110 for connecting various features in the semiconductor device 100. Other dielectric layers and conductive features are within the scope of the present invention.

Located over the dielectric layer 110 and the conductive feature 120 is a substrate 130. The substrate 130, similar to the substrate 110, may comprise an interlevel dielectric layer. In the particular embodiment shown and discussed with respect to FIG. 1 the substrate 130 is an interlevel dielectric layer comprising fluoro-silicate glass (FSG). Nevertheless, the substrate 130 may comprise other layers and stay within the scope of the present invention.

Positioned over the substrate 130 is a graded capping layer 140. The graded capping layer 140 is typically designed to reduce the amount of dopant diffusion within the semiconductor device 100. In the particular embodiment of FIG. 1, the graded capping layer 140 comprises a silicon-rich oxide, and is designed to reduce, or substantially prevent, fluorine diffusion from the FSG substrate 130 to other areas of the semiconductor device 100.

The graded capping layer 140, in accordance with the principles of the present invention, includes at least two different layers. In the embodiment of FIG. 1, the graded capping layer 140 includes a first layer 143 and a second layer 148, wherein the first and second layers 143, 148, have different stress values from one another. Particularly, the first and second layers 143, 148, have different compressive stress values from one another. While the graded capping layer 140 is illustrated in FIG. 1 as including only the first and second layers 143, 148, those skilled in the art understand that the present invention is not limited by this, and that any number of layers, particularly from about 2 to about 6 layers, might be used. Similarly, the graded capping layer 140 may have a range of thicknesses, including a thickness ranging from about 200 nm to about 600 nm.

In an exemplary embodiment, whether the graded capping layer 140 includes only the first and second layers 143, 148, or an infinite number of layers, the stress value of the layers increases as the individual layers move away from the substrate 130. In particular, each of the individual layers desirably has a compressive stress value ranging from about 10 MPa to about 100 MPa. For example in the embodiment of FIG. 1, the first layer 143 of the graded capping layer 140 optimally has a compressive stress value ranging from about 30 MPa to about 40 MPa and the second layer 148 has a compressive stress value ranging from about 70 MPa to about 90 MPa.

Unique to the present invention is the ability to use the graded capping layer 140 to reduce dopant diffusion without imparting the stress issues introduced by the prior art. For example, the graded capping layer 140 of the present invention does not introduce the wafer warpage introduced with using a single layer tensile stressed capping layer. Additionally, the graded capping layer 140 of the present invention does not experience the lateral dopant diffusion experienced by the single layer compressive stressed capping layer. Accordingly, the graded capping layer 140 allows the present invention to compensate for the high tensile stress in the aluminum without accelerating the lateral dopant diffusion.

Figure 2:
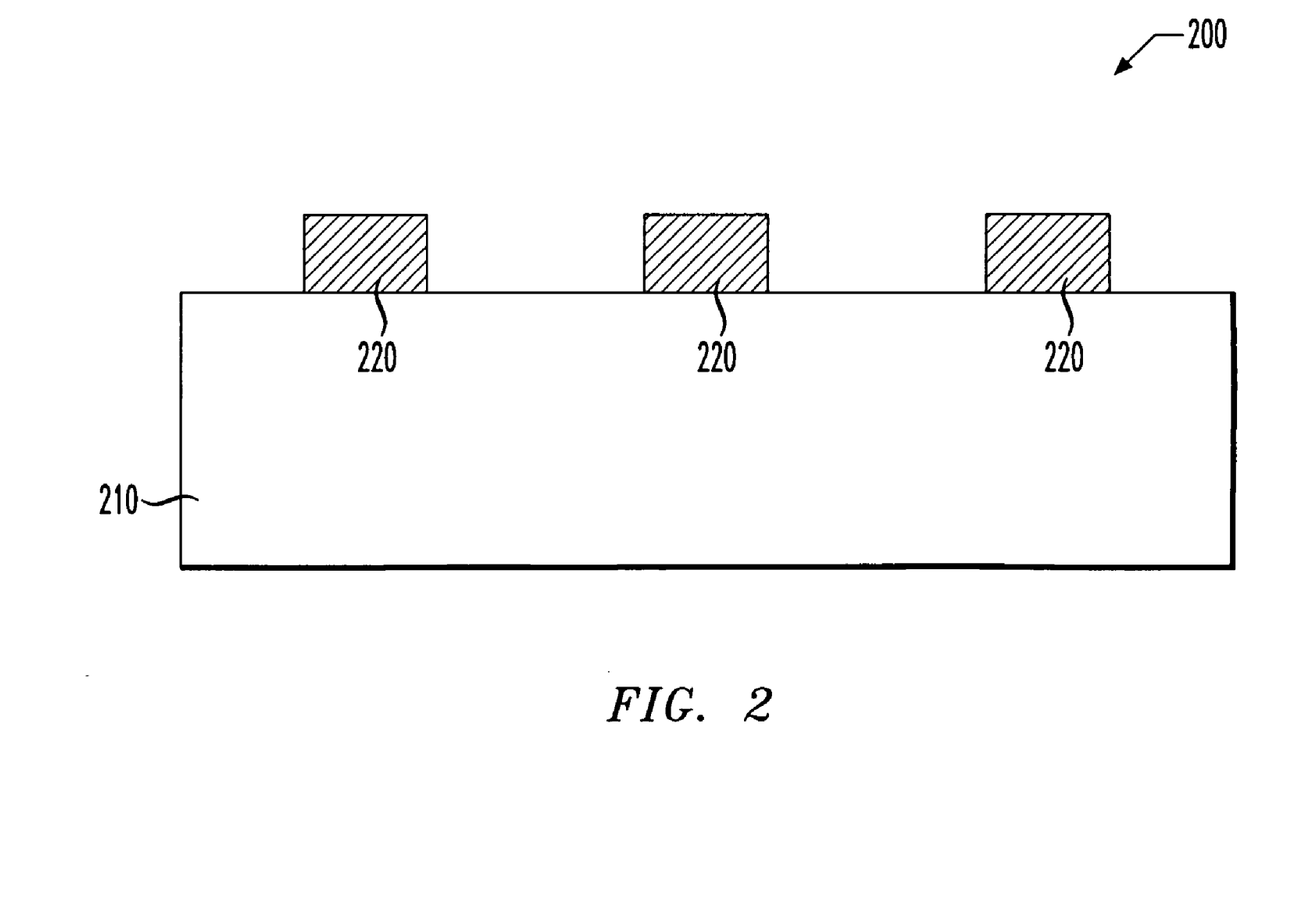
FIG. 2 illustrates a cross-sectional view of a partially completed semiconductor device at an initial stage of manufacture.

Turning now to FIGS. 2–5, illustrated are cross-sectional views of detailed manufacturing steps instructing how one might, in an advantageous embodiment, manufacture an semiconductor device similar to the semiconductor device 100 depicted in FIG. 1. FIG. 2 illustrates a cross-sectional view of a partially completed semiconductor device 200 at an initial stage of manufacture. The partially completed semiconductor device 200 includes a substrate 210 having conductive features 220 located thereon. As previously recited, the substrate 210 could be an interlevel dielectric layer or another similar layer, as well as the conductive features 220 could be interconnects, runners, etc. Both the substrate 210 and conductive features 220 have been conventionally formed.

Figure 3:
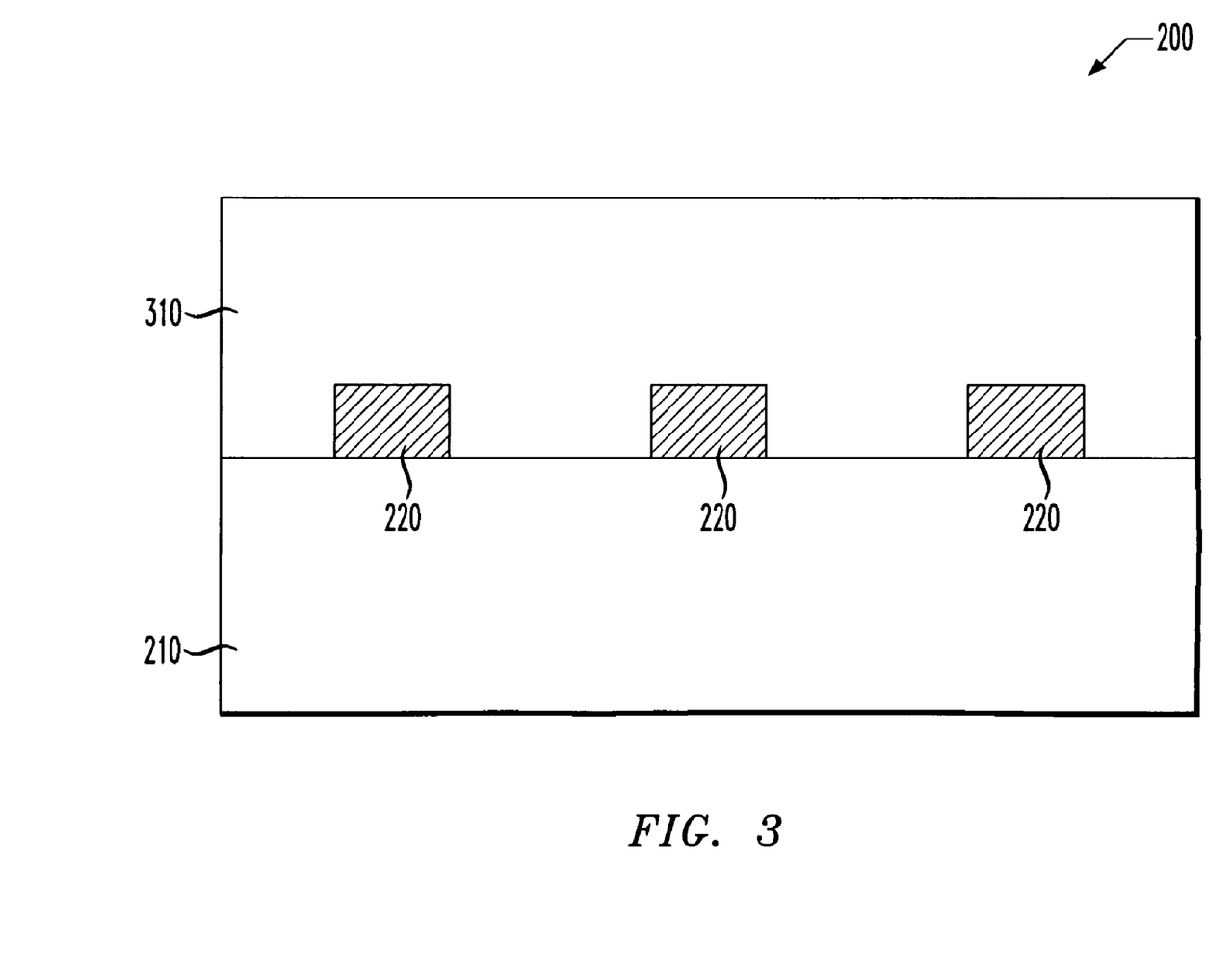
FIG. 3 illustrates a cross-sectional view of the partially completed semiconductor device illustrated in FIG. 2 after formation of a substrate over the conductive features.

Turning now to FIG. 3, illustrated is a cross-sectional view of the partially completed semiconductor device 200 illustrated in FIG. 2 after formation of a substrate 310 over the conductive features 220. More often than not, the substrate 310 is an interlevel dielectric layer, in which case it might have a thickness ranging from about 1.0 $\mu$m to about 2.0 $\mu$m, and more particularly a thickness of about 1.6 $\mu$m.

The substrate 310 may comprise a number of different materials while staying within the scope of the present invention. In the particular embodiment shown in FIG. 3, however, the substrate 310 comprises fluoro-silicate glass. In the instance the substrate 310 is a fluoro-silicate glass interlevel dielectric layer, the substrate 310 might be formed using a plasma enhanced chemical vapor deposition (PECVD) process employing a mixture of $SiH_4$, $SiF_4$, $O_2$ and Ar gases. Additionally, the substrate 310 could be formed employing a deposition temperature ranging from about 300° C. to about 500° C., with an optimal temperature of about 400° C. As control of the fluorine content in the substrate 310 may be important, other deposition conditions, such as gas flows, pressure, top power/side power, bias power, etc., may be optimized to provide the specific desired fluorine content. While certain specifics have been given with respect to forming the substrate 310, those skilled in the art understand that a number of different processes and conditions might be used to form the substrate 310.

Figure 4:
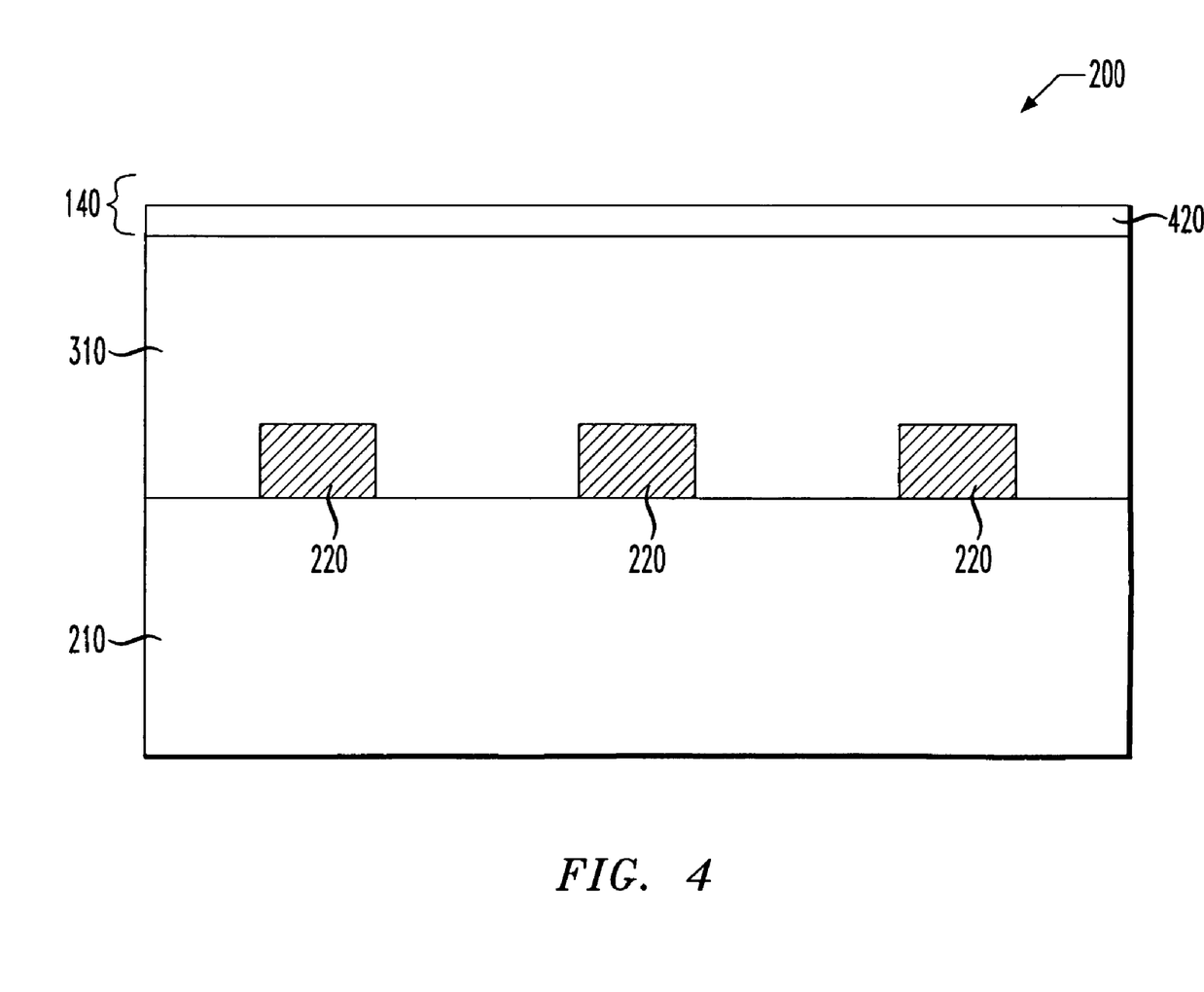
FIG. 4 illustrates a cross-sectional view of the partially completed semiconductor device illustrated in FIG. 3 after beginning to form a graded capping layer, for example by forming a first layer.

Turning now to FIG. 4, illustrated is a cross-sectional view of the partially completed semiconductor device 200 illustrated in FIG. 3 after beginning to form a graded capping layer 410, for example by forming a first layer 420. The first layer 420, which may have a thickness ranging from about 100 nm to about 300 nm, and particularly a thickness of around about 200 nm, comprises a silicon-rich oxide in the embodiment illustrated in FIG. 4. Other types of material and thicknesses are, however, within the scope of the present invention.

The first layer 420 may be formed using a dual frequency PECVD process. As those skilled in the art are well aware, a dual frequency PECVD process requires that both the upper and lower electrodes be modulated at a particular, and often different, frequency. This dual frequency process, which may be conducted at an RF power ranging from about 500 Watts to about 700 Watts, depending on the electrode, provides the precise compressive stress desired in the first layer 420. For example, the precise compressive stress desired in the first layer 420, among others, should range from about 30 MPa to about 40 MPa. Similarly, the first layer 420 may be formed using a mixture of $SiH_4$, $N_2O$ and $N_2$ at a deposition temperature ranging from about 300° C. to about 500° C., with an optimal temperature of about 400° C.

Figure 5:
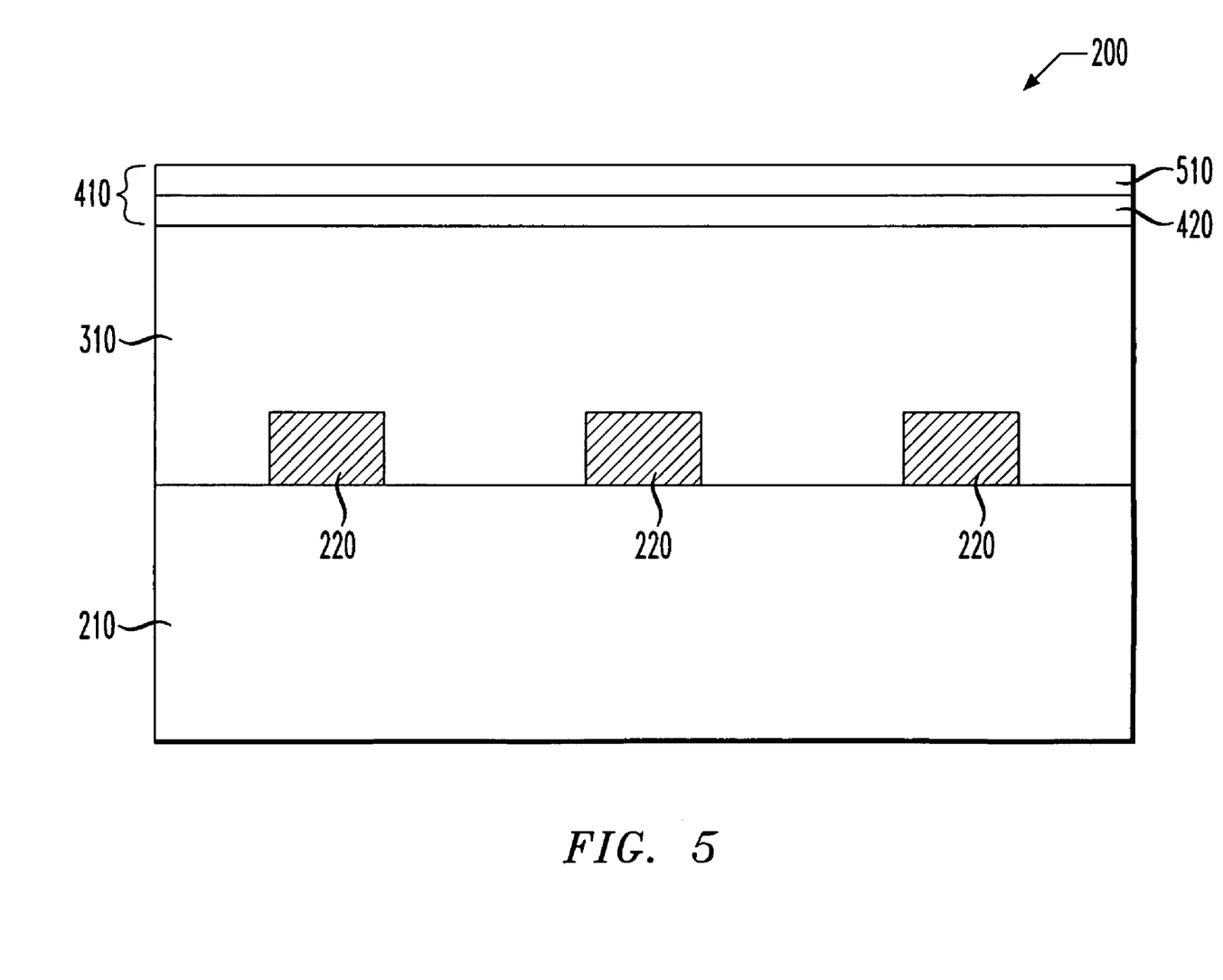
FIG. 5 illustrates a cross-sectional view of the partially completed semiconductor device illustrated in FIG. 4 after continuing to form the graded capping layer, for example forming a second layer.

Turning now to FIG. 5, illustrated is a cross-sectional view of the partially completed semiconductor device 200 illustrated in FIG. 4 after continuing to form the graded capping layer 410, for example by forming a second layer 510. Similar to the first layer 420, the second layer 510 may have a thickness ranging from about 100 nm to about 300 nm, and particularly a thickness around about 200 nm. Additionally, the second layer 510 may comprise a silicon-rich oxide as depicted in the embodiment illustrated in FIG. 5. Other types of material and thicknesses are, however, within the scope of the present invention.

Similar to the first layer 420, the second layer 510 may be formed using a dual frequency PECVD process. This dual frequency process, which may be conducted at an RF power ranging from about 500 Watts to about 700 Watts, depending on the electrode, provides the precise compressive stress desired in the second layer 510. For example, the precise compressive stress desired in the second layer 510, among others, should range from about 70 MPa to about 90 MPa. Similarly, the second layer 510 may also be formed using a mixture of $SiH_4$, $N_2O$ and $N_2$ at a deposition temperature ranging from about 300° C. to about 500° C., with an optimal temperature of about 400° C.

After completing the partially completed semiconductor device 200 illustrated in FIG. 5, additional layers of the graded capping layer could be formed over the second layer 510, or alternatively the manufacturing process could halt, resulting with a completed semiconductor device similar to the semiconductor device 100 illustrated in FIG. 1. If additional layers were to be formed, many of the specifications of the first and second layers 420, 510, described above might change. Particularly, the compressive stress values for the first and second layers 420, 510, might change to accommodate the additional layers. Regardless of the situation, the graded capping layer constructed in accordance with the principles of the present invention does not experience and/or introduce the issues experienced and/or introduced by the prior art capping layers. Particularly, the graded capping layer does not impart the wafer warping introduced by the conventional single layer tensile capping layer. Additionally, the graded capping layer does not allow the substantial dopant diffusion allowed by the conventional single layer compressive capping layer.

Figure 6:
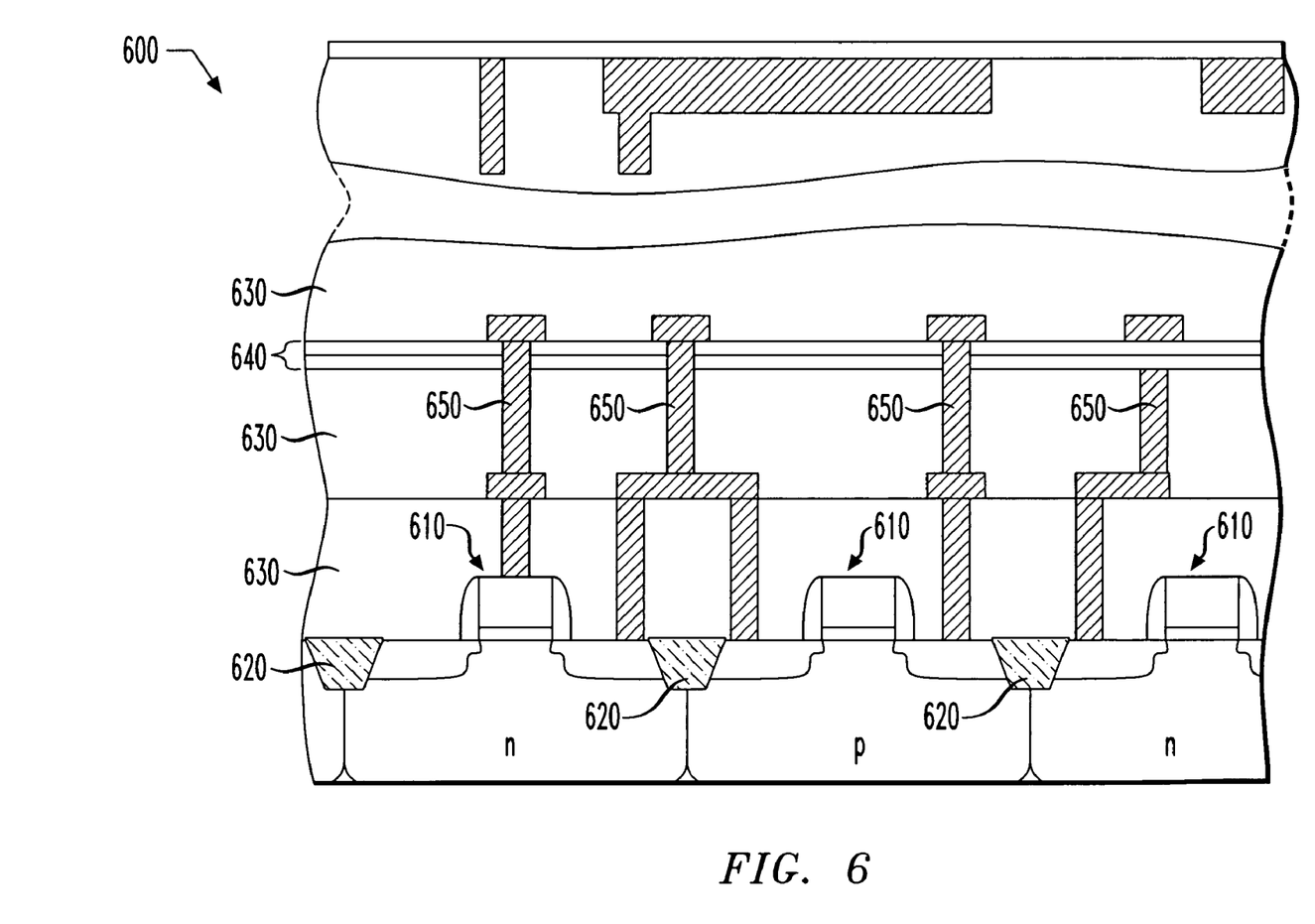
FIG. 6 illustrates a cross-sectional view of an integrated circuit (IC) incorporating a graded capping layer constructed according to the principles of the present invention.

Referring finally to FIG. 6, illustrated is a cross-sectional view of an integrated circuit (IC) 600 incorporating a graded capping layer constructed according to the principles of the present invention. The IC 600 may include devices, such as transistors used to form CMOS devices, BiCMOS devices, Bipolar devices, or other types of devices. The IC 600 may further include passive devices, such as inductors or resistors, or it may also include optical devices or optoelectronic devices. Those skilled in the art are familiar with these various types of devices and their manufacture.

In the particular embodiment illustrated in FIG. 6, the IC 600 includes semiconductor devices 610 located between isolation structures 620. The IC 600 of FIG. 6 further includes dielectric layers 630 located over the semiconductor devices 610. In accordance with the principles of the present invention, a graded capping layer 640 is located over the dielectric layers 630. Additionally, contacts 650 are located within the dielectric layers 630 to interconnect various devices, thus, forming the operational IC 600.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a substrate; and
   a graded capping layer located over said substrate, wherein said graded capping layer includes at least two different layers, wherein first and second layers of said at least two different layers have different compressive stress values that increase as said first and second layers move away from said substrate.

2. The semiconductor device as recited in claim 1 wherein said substrate comprises an interlevel dielectric material.

3. The semiconductor device as recited in claim 2 wherein said interlevel dielectric material comprises fluoro-silicate glass.

4. The semiconductor device as recited in claim 1 wherein said graded capping layer includes from about 2 to about 6 different layers, each of said different layers having different stress values.

5. The semiconductor device as recited in claim 1 wherein said first layer has a compressive stress value ranging from about 30 MPa to about 40 MPa and said second layer has a compressive stress value ranging from about 70 MPa to about 90 MPa.

6. The semiconductor device as recited in claim 1 wherein each of said first and second layers has a thickness ranging from about 100 nm to about 300 nm.

7. A method for manufacturing a semiconductor device, comprising:
   providing a substrate; and
   forming a graded capping layer over said substrate, wherein said graded capping layer includes at least two different layers, wherein first and second layers of said at least two different layers have different compressive stress values that increase as said first and second layers move away from said substrate.

8. The method as recited in claim 7 wherein providing a substrate includes providing an interlevel dielectric layer.

9. The method as recited in claim 8 wherein providing an interlevel dielectric layer includes providing an interlevel dielectric layer comprising fluoro-silicate glass.

10. The method as recited in claim 7 wherein forming a graded capping layer including at least two different layers includes forming a graded capping layer including from about 2 to about 6 different layers, each of said different layers having different stress values.

11. The method as recited in claim 7 wherein said first layer has a compressive stress value ranging from about 30 MPa to about 40 MPa and said second layer has a compressive stress value ranging from about 70 MPa to about 90 MPa.

12. The method as recited in claim 7 wherein forming a graded capping layer includes forming a graded capping layer using a dual frequency RF power ranging from about 500 Watts to about 700 Watts.

13. The method as recited in claim 7 wherein forming a graded capping layer includes forming a silicon rich oxide graded capping layer.

14. An integrated circuit, comprising:
transistors located over a semiconductor substrate;
an interlevel dielectric layer located over said transistors;
a graded capping layer located over said interlevel dielectric layer, wherein said graded capping layer includes at least two different layers, wherein first and second layers of said at least two different layers have different compressive stress values that increase as said first and second layers move away from said substrate; and
interconnects located in said interlevel dielectric layer for contacting said transistors and thereby forming an operational integrated circuit.

15. The integrated circuit as recited in claim 14 wherein said first and second layers have different compressive stress values and further wherein said compressive stress values of said first and second layers increase as said layers move away from said substrate.

16. The integrated circuit as recited in claim 14 wherein said transistors are selected from the group consisting of:
   CMOS devices;
   BiCMOS devices; and
   bipolar devices.

* * * * *